United States Patent
Dordi et al.

(10) Patent No.: US 7,752,996 B2
(45) Date of Patent: Jul. 13, 2010

(54) APPARATUS FOR APPLYING A PLATING SOLUTION FOR ELECTROLESS DEPOSITION

(75) Inventors: Yezdi Dordi, Palo Alto, CA (US); William Thie, Mountain Viiew, CA (US); John M. Boyd, Woodlawn (CA); Fritz C. Redeker, Fremont, CA (US); Aleksander Owczarz, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 165 days.

(21) Appl. No.: 11/611,736

(22) Filed: Dec. 15, 2006

(65) Prior Publication Data

US 2007/0264436 A1    Nov. 15, 2007

Related U.S. Application Data

(63) Continuation-in-part of application No. 11/513,634, filed on Aug. 30, 2006, and a continuation-in-part of application No. 11/514,038, filed on Aug. 30, 2006, and a continuation-in-part of application No. 11/513,446, filed on Aug. 30, 2006, and a continuation-in-part of application No. 11/382,906, filed on May 11, 2006, now Pat. No. 7,306,662, and a continuation-in-part of application No. 11/427,266, filed on Jun. 28, 2006, now Pat. No. 7,297,190.

(51) Int. Cl.
*B05C 11/06* (2006.01)
*B05C 11/02* (2006.01)
*B08B 5/00* (2006.01)
*B08B 3/00* (2006.01)

(52) U.S. Cl. .................. 118/320; 118/326; 118/52; 118/50; 118/58; 134/153; 134/198; 134/902; 134/31

(58) Field of Classification Search ............ 118/52, 118/612, 319, 320, 56, 70, 326, 50, 500, 118/416, 429, 58, 62, 63; 427/240, 345, 427/350, 353; 396/604, 611, 627; 134/153, 134/198, 902, 31; 34/381, 407
See application file for complete search history.

(56) References Cited

U.S. PATENT DOCUMENTS

| | | | | |
|---|---|---|---|---|
| 4,393,807 | A * | 7/1983 | Fujimura et al. | 118/501 |
| 5,906,860 | A * | 5/1999 | Motoda et al. | 427/240 |
| 5,952,149 | A * | 9/1999 | Sakai et al. | 430/270.1 |
| 5,965,200 | A * | 10/1999 | Tateyama et al. | 427/240 |
| 6,383,294 | B1 * | 5/2002 | Nakamura et al. | 118/666 |
| 6,954,993 | B1 | 10/2005 | Smith et al. | |
| 2003/0172955 | A1 * | 9/2003 | Kuroda et al. | 134/2 |
| 2005/0263066 | A1 | 12/2005 | Lubomirsky et al. | |
| 2006/0102069 | A1 * | 5/2006 | Tokuri et al. | 118/52 |

* cited by examiner

*Primary Examiner*—Yewebdar T Tadesse
(74) *Attorney, Agent, or Firm*—Martine Penilla & Gencarella, LLP

(57) ABSTRACT

An electroless plating chamber is provided. The electroless plating chamber includes a chuck configured to support a substrate and a bowl surrounding a base and a sidewall of the chuck. The base has an annular channel defined along an inner diameter of the base. The chamber includes a drain connected to the annular channel. The drain is capable of removing fluid collected from the chuck. A proximity head capable of cleaning and substantially drying the substrate is included in the chamber. A method for performing an electroless plating operation is also provided.

9 Claims, 4 Drawing Sheets

APPARATUS FOR APPLYING A PLATING SOLUTION FOR ELECTROLESS DEPOSITION

CLAIM OF PRIORITY

This application is a continuation in part and claims priority of U.S. patent application Ser. No. 11/513,634, filed Aug. 30, 2006 entitled "Processes and Systems for Engineering a Copper Surface for Selective Copper Deposition," U.S. patent application Ser. No. 11/514,038, file Aug. 30, 2006 entitled "Processes and Systems for Engineering a Barrier Surface for Selective Copper Deposition," and U.S. patent application Ser. No. 11/513,446, filed Aug. 30, 2006 entitled "Processes and Systems for Engineering a Silicon-Type Surface for Selective Metal Deposition to Form a Metal Silicide," U.S. patent application Ser. No. 11/382,906, filed May 11, 2006 now U.S. Pat. No. 7,306,662 entitled "Plating Solution for Electroless Deposition of Copper," U.S. patent application Ser. No. 11/427,266, filed Jun. 28, 2006 now U.S. Pat. No. 7,297,190 entitled "Plating Solutions for Electroless Deposition of Copper," all of which are filed on the same day as the instant application. The disclosure of these related applications is incorporated herein by reference in their entireties for all purposes.

CROSS REFERENCE TO RELATED APPLICATION

This application is related to U.S. Provisional Application Ser. No. 60/686,787, titled "High Rate Electroless Plating and Integration Flow to Form Cu Interconnects," filed on Aug. 31, 2005, and U.S. application Ser. No. 11/461,415, titled "System and Method for Forming Patterned Copper lines Through Electroless Copper Plating," filed on Jul. 27, 2006, both of which are hereby incorporated by reference.

BACKGROUND

The fabrication of semiconductor devices such as integrated circuits, memory cells, and the like, involve a series of manufacturing operations that are performed to define features on semiconductor wafers ("wafers"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

To build an integrated circuit, transistors are first created on the surface of the wafer. The wiring and insulating structures are then added as multiple thin-film layers through a series of manufacturing process steps. Typically, a first layer of dielectric (insulating) material is deposited on top of the formed transistors. Subsequent layers of metal (e.g., copper, aluminum, etc.) are formed on top of this base layer, etched to create the conductive lines that carry the electricity, and then filled with dielectric material to create the necessary insulators between the lines. The process used for producing copper lines is referred to as a dual Damascene process, where trenches are formed in a planar conformal dielectric layer, vias are formed in the trenches to open a contact to the underlying metal layer previously formed, and copper is deposited everywhere. Copper is then planarized (overburden removed), leaving copper in the vias and trenches only.

Although copper lines are typically comprised of a plasma vapor deposition (PVD) seed layer (i.e., PVD Cu) followed by an electroplated layer (i.e., ECP Cu), electroless chemistries are under consideration for use as a PVD Cu replacement, and even as an ECP Cu replacement. A process called electroless copper deposition can thus be used to build the copper conduction lines. During electroless copper deposition, electrons are transferred from a reducing agent to the copper ions resulting in the deposition of reduced copper onto the wafer surface. The formulation of the electroless copper plating solution is optimized to maximize the electron transfer process involving the copper ions.

Conventional formulations call for maintaining the electroless plating solution at a high alkaline pH (i.e., pH>9) to enhance the overall deposition rate. The limitations with using highly alkaline copper plating solutions for electroless copper deposition are non-compatibility with positive photoresist on the wafer surface, longer induction times, and decreased nucleation density due to an inhibition by hydroxylation of the copper interface (which occurs in neutral-to-alkaline environments). These are limitations that can be eliminated if the solution is maintained at an acidic pH environment (i.e., pH<7). One prominent limitation found with using acidic electroless copper plating solutions is that certain substrate surfaces, such as tantalum nitride (TaN), tend to get oxidized readily in an alkaline environment causing adhesion problems for the reduced copper resulting in blotchy plating on the TaN surfaces of the wafer. Efforts to counteract this limitation by seeding the TaN surfaces with various metals such as palladium and ruthenium have resulted in minimal levels of success primarily due to increase of the line resistance. With the growing interest in electroless plating solutions, is a concomitant interest in chambers capable of providing the environment for depositing the electroless plating solutions, especially with regard to solutions that tend to oxidize easily, e.g., cobalt plating solutions as well as copper plating solutions.

In view of the forgoing, there is a need for a chamber that enables the efficient use of improved formulations of copper plating solutions for use in electroless copper deposition processes, as well as other sensitive plating solutions.

SUMMARY

Broadly speaking, the present invention fills these needs by providing a chamber for enabling the use of the electroless plating solutions in a controlled environment. It should be appreciated that the present invention can be implemented in numerous ways, including as a method and a chemical solution. Several inventive embodiments of the present invention are described below.

In one exemplary embodiment, an electroless plating chamber is provided. The electroless plating chamber includes a chuck configured to support a substrate and a bowl surrounding a base and a sidewall of the chuck. The base has an annular channel defined along an inner diameter of the base. The chamber includes a drain connected to the annular channel. The drain is capable of removing fluid collected from the chuck. A proximity head capable of cleaning and substantially drying the substrate is included in the chamber.

In another aspect of the invention, a method for performing an electroless plating operation in a single chamber is provided. The method initiates with depositing a plating solution onto a surface of a substrate. The method includes plating a layer onto the surface of the substrate. The top surface of the substrate is sprayed to remove the plating solution and the top surface of the substrate is substantially dried. In one embodiment, a proximity head is used for rinsing and drying the substrate in a substantially oxygen free environment within the chamber.

It will be obvious, however, to one skilled in the art, that embodiments of the present invention may be practiced without some or all of these specific details. In other instances, well known process operations have not been described in detail in order not to obscure the present invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1:
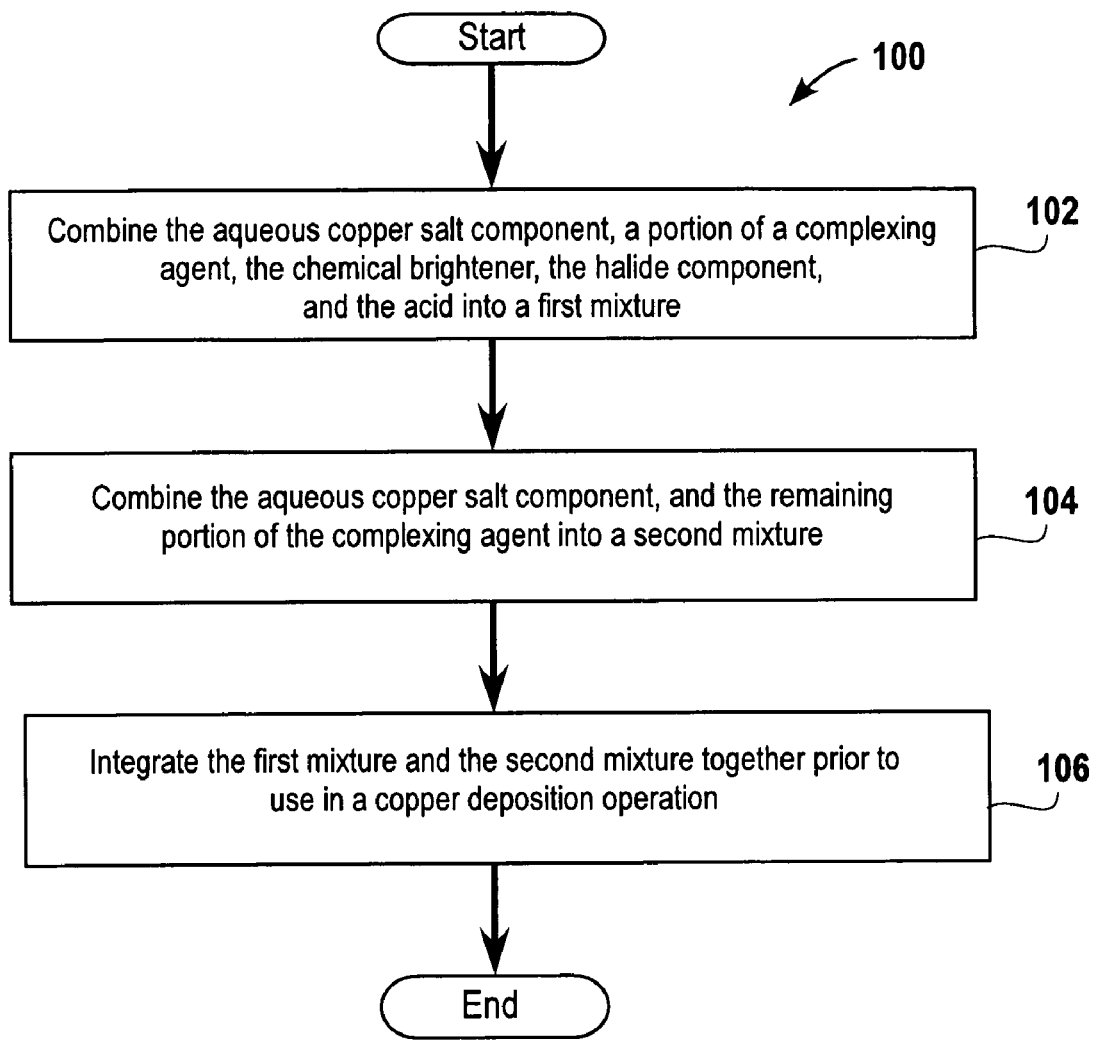
FIG. 1 is a flow chart of a method for preparing an electroless copper plating solution, in accordance with one embodiment of the present invention.

An invention is described for providing improved formulations of electroless copper plating solutions that can be maintained in an acidic pH to weakly alkaline environment for use in electroless copper deposition processes and a chamber for performing the plating operation therein. It should be appreciated that while specific plating solutions are described herein, the chamber may be used for any plating solution and is not limited for use with the specifically mentioned plating solutions. It will be obvious, however, to one skilled in the art, that the present invention may be practiced without some or all of these specific details. In other instances, well known process operations have not been described in detail in order not to unnecessarily obscure the present invention.

Electroless metal deposition processes used in semiconductor manufacturing applications are based upon simple electron transfer concepts. The processes involve placing a prepared semiconductor wafer into an electroless metal plating solution bath then inducing the metal ions to accept electrons from a reducing agent resulting in the deposition of the reduced metal onto the surface of the wafer. The success of the electroless metal deposition process is highly dependent upon the various physical (e.g., temperature, etc.) and chemical (e.g., pH, reagents, etc.) parameters of the plating solution. As used herein, a reducing agent is an element or compound in an oxidation-reduction reaction that reduces another compound or element. In doing so, the reducing agent becomes oxidized. That is, the reducing agent is an electron donor that donates an electron to the compound or element being reduced.

A complexing agent (i.e., chelators or chelating agent) is any chemical agent that can be utilized to reversibly bind to compounds and elements to form a complex. A salt is any ionic compound composed of positively charged cations (e.g., $Cu^{2+}$, etc.) and negatively charged anions, so that the product is neutral and without a net charge. A simple salt is any salt species that contain only one kind of positive ion (other than the hydrogen ion in acid salts). A complex salt is any salt species that contains a complex ion that is made up of a metallic ion attached to one or more electron-donating molecules. Typically a complex ion consists of a metallic atom or ion to which is attached one or more electron-donating molecules (e.g., Cu(II)ethylenediamine2+, etc.). A protonized compound is one that has accepted a hydrogen ion (i.e., H+) to form a compound with a net positive charge.

A copper plating solution for use in electroless copper deposition applications is disclosed below. The components of the solution are a copper(II) salt, a cobalt(II) salt, a chemical brightener component, and a polyamine-based complexing agent. In one exemplary embodiment, the copper plating solution is prepared using de-oxygenated liquids. Use of de-oxygenated liquids substantially eliminates oxidation of the wafer surfaces and nullifies any effect that the liquids may have on the redox potential of the final prepared copper plating solution. In one embodiment, the copper plating solution further includes a halide component. Examples of halide species that can be used include fluoride, chloride, bromide, and iodide.

In one embodiment, the copper(II) salt is a simple salt. Examples of simple copper(II) salts include copper(II) sulfate, copper(II) nitrate, copper(II) chloride, copper(II) tetrafluoroborate, copper(II) acetate, and mixtures thereof. It should be appreciated that essentially any simple salt of copper(II) can be used in the solution so long as the salt can be effectively solubilized into solution, be complexed by a polyamine-based complexing agent, and oxidized by a reducing agent in an acidic environment to result in deposition of the reduced copper onto the surface of the wafer.

In one embodiment, the copper(II) salt is a complex salt with a polyamine electron-donating molecule attached to the copper(II) ion. Examples of complex copper(II) salts include copper(II) ethylenediamine sulfate, bis(ethylenediamine) copper(II) sulfate, copper(II) dietheylenetriamine nitrate, bis (dietheylenetriamine)copper(II) nitrate, and mixtures thereof. It should be appreciated that essentially any complex salt of copper(II) attached to a polyamine molecule can be used in the solution so long as the resulting salt can be solubilized into solution, be complexed to a polyamine-based complexing agent, and oxidized by a reducing agent in an acidic environment to result in deposition of the reduced copper onto the surface of the wafer.

In one embodiment, the concentration of the copper(II) salt component of the copper plating solution is maintained at a concentration of between about 0.0001 molarity (M) and the solubility limit of the various copper(II) salts disclosed above. In another exemplary embodiment, the concentration of the copper(II) salt component of the copper plating solution is maintained at between about 0.001 M and 1.0 M or the solubility limit. It should be understood that the concentration of the copper(II) salt component of the copper plating solution can essentially be adjusted to any value up to the solubility limit of the copper(II) salt as long as the resulting copper plating solution can effectuate electroless deposition of copper on a wafer surface during an electroless copper deposition process.

In one embodiment, the cobalt(II) salt is a simple cobalt salt. Examples of simple cobalt(II) salts include cobalt(II) sulfate, cobalt(II) chloride, cobalt(II) nitrate, cobalt(II) tetrafluoroborate, cobalt(II) acetate, and mixtures thereof. It should be understood that essentially any simple salt of cobalt (II) can be used in the solution so long as the salt can be effectively solubilized in the solution, be complexed to a polyamine-based complexing agent, and reduce a cobalt(II)

salt in an acidic environment to result in the deposition of the reduced copper onto the surface of the wafer.

In another embodiment, the cobalt(II) salt is a complex salt with a polyamine electron-donating molecule attached to the cobalt(II) ion. Examples of complex cobalt(II) salts include cobalt(II) ethylenediamine sulfate, bis(ethylenediamine)cobalt(II) sulfate, cobalt(II) dietheylenetriamine nitrate, bis(dietheylenetriamine)cobalt(II) nitrate, and mixtures thereof. It should be understood that essentially any simple salt of cobalt (II) can be used in the solution so long as the salt can be effectively solubilized into solution, be complexed to a polyamine-based complexing agent and reduce a copper(II) salt in an acidic environment to result in the deposition of the reduced copper onto the surface of the wafer.

In one embodiment, the concentration of the cobalt (II) salt component of the copper plating solution is maintained at between about 0.0001 molarity (M) and the solubility limit of the various cobalt(II) salt species disclosed above. In one exemplary embodiment, the concentration of the cobalt(II) salt component of the copper plating solution is maintained at between about 0.001 M and 1.0 M. It should be understood that the concentration of the cobalt(II) salt component of the copper plating solution can essentially be adjusted to any value up to the solubility limit of the cobalt(II) salt as long as the resulting copper plating solution can effectuate electroless deposition of copper on a wafer surface at an acceptable rate during an electroless copper deposition process.

In one embodiment, the chemical brightener component works within the film layer to control copper deposition on a microscopic level. The brightener tends to be attracted to points of high electro-potential, temporarily packing the area and forcing copper to deposit elsewhere in this embodiment. It should be appreciated that as soon as the deposit levels, the local point of high potential disappears and the brightener drifts away, i.e., brighteners inhibit the normal tendency of the copper plating solution to preferentially plate areas of high potential which would inevitably result in rough, dull plating. By continuously moving between surfaces with the highest potential, brighteners (also referred to as levelers) prevent the formation of large copper crystals, giving the highest possible packing density of small equiaxed crystals (i.e., nucleation enhancement), which results in a smooth, glossy, high ductility copper deposition in this embodiment. One exemplary brightener is bis-(3-sulfopropyl)-disulfide disodium salt (SPS), however, any small molecular weight sulfur containing compounds that increase the plating reaction by displacing an adsorbed carrier may function in the embodiments described herein. In one embodiment, the concentration of the chemical brightener component is maintained at between about 0.000001 molarity (M) and the solubility limit for the brightener. In another embodiment, the chemical brightener component has a concentration of between about 0.000001 M and about 0.01 M. In still another embodiment, the chemical brightener has a concentration of about between 0.000141 M and about 0.000282 M. It should be appreciated that the concentration of the chemical brightener component of the copper plating solution can essentially be adjusted to any value up to the solubility limit of the chemical brightener as long as the nucleation enhancing properties of the chemical brightener is maintained in the resulting copper plating solution to allow for a sufficiently dense deposition of copper on the wafer surface.

In one embodiment, the polyamine-based complexing agent is a diamine compound. Examples of diamine compounds that can be utilized for the solution include ethylenediamine, propylenediamine, 3-methylenediamine, and mixtures thereof. In another embodiment, the polyamine-based complexing agent is a triamine compound. Examples of triamine compounds that can be utilized for the solution include diethylenetriamine, dipropylenetriamine, ethylene propylenetriamine, and mixtures thereof. In still another embodiment, the polyamine-based complexing agent is an aromatic or cyclic polyamine compound. Examples of aromatic polyamine compounds include benzene-1,2-diamine, pyridine, dipyride, pyridine-1-amine. It should be understood that essentially any diamine, triamine, or aromatic polyamine compound can be used as the complexing agent for the plating solution so long as the compound can complex with the free metal ions in the solution (i.e., copper(II) metal ions and cobalt(II) metal ions), be readily solubilized in the solution, and be protonized in an acidic environment. In one embodiment, other chemical additives including accelerators (i.e., sulfopropyl sulfonate) and suppressors (i.e., PEG, polyethylene glycol) are included in the copper plating solution at low concentrations to enhance the application specific performance of the solution.

In another embodiment, the concentration of the complexing agent component of the copper plating solution is maintained at between about 0.0001 molarity (M) and the is solubility limit of the various diamine-based, triamine-based, and aromatic or cyclic polyamine complexing agent species disclosed above. In one exemplary embodiment, the concentration of the complexing agent component of the copper plating solution is maintained at between about 0.005 M and 10.0 M, but must be greater than the total metal concentration in solution.

Typically, the complexing agent component of a copper plating solution causes the solution to be highly alkaline and therefore somewhat unstable (due to too large a potential difference between the copper(II) -cobalt(II) redox couple). In one exemplary embodiment, an acid is added to the plating solution in sufficient quantities to make the solution acidic with a pH$\leqq$about 6.4. In another embodiment, a buffering agent is added to make the solution acidic with a pH$\leqq$about 6.4 and to prevent changes to the resulting pH of the solution after adjustment. In still another embodiment, an acid and/or a buffering agent is added to maintain the pH of the solution at between about 4.0 and 6.4. In yet another embodiment, an acid and/or a buffering agent is added to maintain the pH of the solution at between about 4.3 and 4.6. In one embodiment, the anionic species of the acid matches the respective anionic species of the copper(II) and cobalt(II) salt components of the copper plating solution, however it should be appreciated that the anionic species do not have to match. In yet another embodiment, a pH modifying substance is added to make the solution weakly alkaline, i.e., a pH of less than about 8.

Acidic copper plating solutions have many operational advantages over alkaline plating solutions when utilized in an electroless copper deposition application. An acidic copper plating solution improves the adhesion of the reduced copper ions that are deposited on the wafer surface. This is often a problem observed with alkaline copper plating solutions due to the formation of hydroxyl-terminated groups, inhibiting the nucleation reaction and causing reduced nucleation density, larger grain growth and increased surface roughness. Still further, for applications such as direct patterning of copper lines by electroless deposition of copper through a patterned film, an acidic copper plating solution helps improve selectivity over the barrier and mask materials on the wafer surface, and allows the use of a standard positive resist photomask resin material that would normally dissolve in a basic solution.

In addition to the advantages discussed above, copper deposited using the acidic copper plating solutions exhibits lower pre-anneal resistance characteristics than with copper deposited using alkaline copper plating solutions. It should be appreciated that the pH of the copper plating solutions, as disclosed herein, can essentially be adjusted to any acidic (i.e., pH<7.0) environment so long as the resulting deposition rates of copper during the electroless copper deposition process is acceptable for the targeted application and the solution exhibits all the operational advantages discussed above. In general, as the pH of the solution is lowered (i.e., made more acidic), the copper deposition rate decreases. However, varying the choice of complexing agent (e.g., diamine-based, triamine-based, aromatic polyamine, etc.) plus the concentration of the copper (II) and cobalt(II) salts can help compensate for any reduction in copper deposition rate resulting from an acidic pH environment.

In one embodiment, the copper plating solution is maintained at a temperature between about 0° Celsius (° C.) and 70° C. during an electroless copper deposition process. In one exemplary embodiment, the copper plating solution is maintained at a temperature of between about 20° C. and 70° C. during the electroless copper deposition process. It should be appreciated that temperature impacts the nucleation density and deposition rate of copper (mainly, the nucleation density and deposition rate of copper is directly proportional to temperature) to the wafer surface during copper deposition. The deposition rate impacts the thickness of the resulting copper layer and the nucleation density impacts void space, occlusion formation within the copper layer, and adhesion of the copper layer to the underlying barrier material. Therefore, the temperature settings for the copper plating solution during the electroless copper deposition process would be optimized to provide dense copper nucleation and controlled deposition following the nucleation phase of the bulk deposition to optimize the copper deposition rate to achieve copper film thickness targets.

FIG. 1 is a flow chart of a method for preparing an electroless copper plating solution, in accordance with one embodiment of the present invention. Method 100 begins with operation 102 where the aqueous copper salt component, a portion of the polyamine-based complexing agent, the chemical brightener component, the halide component, and a portion of the acid component of the copper plating solution are combined into a first mixture. The method 100 proceeds on to operation 104 where the remaining portion of the complexing agent and the aqueous cobalt salt component are combined into a second mixture. In one embodiment, the pH of the second mixture is adjusted so that the second mixture has an acidic pH. It should be appreciated that the advantage of keeping the second mixture acidic is that this will keep the cobalt (II) in an active form. The method 100 then continues on to operation 106 where the first mixture and the second mixture are combined into the final copper plating solution prior to use in a copper plating operation utilizing the system described below.

In one embodiment, the first and the second mixtures are stored in separate permanent storage containers prior to integration. The permanent storage containers being designed to provide transport and long-term storage of the first and second mixtures until they are ready to be combined into the final copper plating solution. Any type of permanent storage container may be used as long as the container is non-reactive with any of the components of the first and the second mixtures. It should be appreciated that this pre-mixing strategy has the advantage of formulating a more stable copper plating solution that will not plate out (that is, resulting in the reduction of the copper) over time in storage.

This invention can be further understood in reference to Example 1 which describes a sample formulation of copper plating solution, in accordance with one embodiment of the present invention.

Example 1

Nitrate-Based Copper Plating Formulation

In this embodiment, a nitrate-based formulation of the copper plating solution is disclosed with a pH of 6.0, a copper nitrate ($Cu(NO_3)_2$) concentration of 0.05 M, a cobalt nitrate ($Co(NO_3)_2$) concentration of 0.15 M, an ethylenediamine (i.e., diamine-based complexing agent) concentration of 0.6 M, a nitric acid ($HNO_3$) concentration of 0.875 M, a potassium bromide (i.e., halide component) concentration of 3 millimolarity (mM), and a SPS (i.e., chemical brightener) concentration of between about 0.000141 M and about 0.000282 M. The resulting mixture is then deoxygenated using Argon gas to reduce the potential for the copper plating solution to become oxidized.

Continuing with Example 1, in one embodiment, the nitrate-based formulation of the copper plating solution is prepared using a pre-mixing formulation strategy that involves pre-mixing a portion of the ethylenediamine with the copper nitrate, the nitric acid, and the potassium bromide into a into a first pre-mixed solution. The remaining portion of the complexing agent component is pre-mixed with the cobalt salt component into a second pre-mixed solution. The first premixed solution and second pre-mixed solution are then added into an appropriate container for final mixing into the final electroless copper plating solution prior to use in an electroless copper deposition operation. As disclosed above, this pre-mixing strategy has the advantage of formulating a more stable copper plating solution that will not plate out over time in storage.

Figure 2:
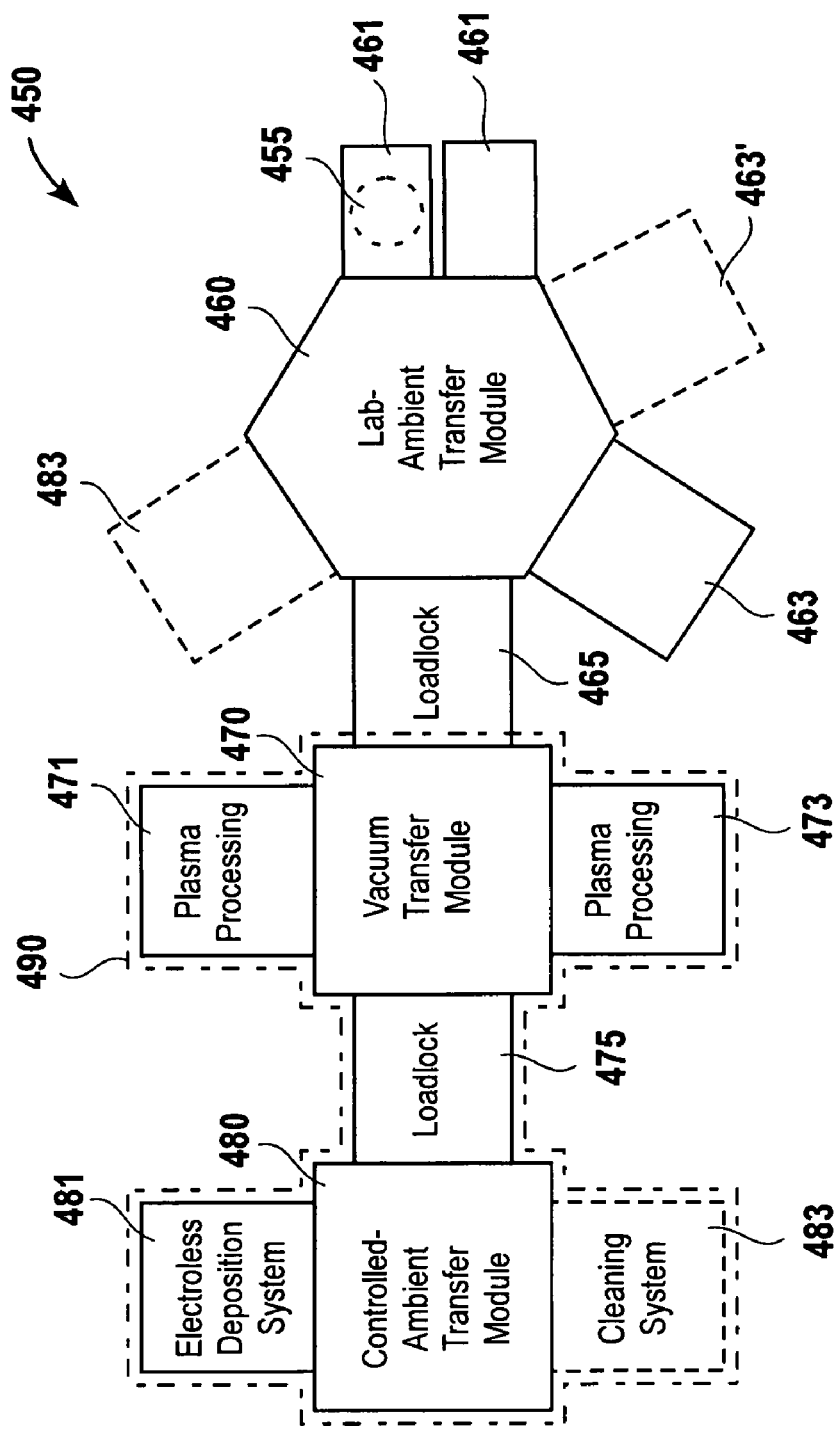
FIG. 2 is a high-level schematic diagram illustrating a manufacturing tool which incorporates an electroless plating chamber to be used with the solutions described herein in accordance with one embodiment of the invention.

FIG. 2 is a high-level schematic diagram illustrating a manufacturing tool which incorporates an electroless plating chamber to be used with the solutions described herein in accordance with one embodiment of the invention. The system includes Front Opening Unified Pods (FOUPs) 461 which handle the incoming and outgoing wafers being delivered into the system and from the system. Lab ambient module 460 is a module that operates at ambient temperature with HEPA filtered air. Modules 463, 463', and 483 operating off of lab ambient module 460 may be cleaning modules. These cleaning modules can perform either wet cleaning or dry cleaning operations on substrate 455 as the substrate is delivered into or taken from system 450. From lab ambient module 460 load lock 465 delivers or transitions substrate 455 between lab ambient module 460 and vacuum module 470. Off of vacuum module 470 are etch chambers and deposition chambers which require vacuum processing or low pressure processing. Etch chamber 471 may include any of the commonly known etch processes and ALD/PVD chamber 473 may perform any of the commonly known deposition processes. From vacuum module 470, the substrate is transitioned between the vacuum chamber and controlled ambient chamber 480 by load lock 475. Controlled ambient chamber 480 and the modules which are associated with the controlled ambient chamber have highly controlled environmental conditions. For example, the controlled ambient chamber may have all oxygen removed, i.e., operate in an inert gas environment, in order to avoid oxidation for processes sensitive to oxidation. Off of controlled ambient chamber 480 is cleaning system 483. Cleaning system 483 may be used to planarize copper after copper fill, i.e., the deposition from ALD/PVD that may be performed in plasma processing chamber 473. It should be appreciated that cleaning system 483 that connected to the controlled ambient module 480, may perform functionally similar operations to cleaning system 483 that is connected to the ambient transfer module 460, with the exception that the cleaning is performed under controlled ambient environmental conditions. For example, the controlled ambient conditions, may include the lack of oxygen, regulated temperature, pressure, among control of other environmental conditions. Electroless deposition module 483 is the module used to perform the electroless plating with the formulations described herein. As mentioned above, electroless deposition module 481 will operate in a controlled ambient environment where the temperature and gas environment is highly controlled. In one embodiment, oxygen has been eliminated from the environment within electroless deposition module 483 in order to prevent oxidation of the formulations used for the electroless deposition processes. Thus, system 450 is an exemplary architecture that allows minimal exposure of substrate surface to oxygen at critical steps after surface treatment. In addition, since system 450 is an integrated system, the substrate is transferred from one process station immediately to the next process station, which limits the duration that for example, a prepared copper surface is exposed to oxygen. The integrated system 450 can be used to process substrates) through an entire process sequence flow as described in more detail in U.S. application Ser. No. 11/513,634.

Still referring to FIG. 2, surface treatments, electroless deposition of cobalt-alloy, and the optional post-cobalt-alloy deposition processes involve a mixture of dry and wet processes. The wet processes are typically operated near atmosphere, while the dry $O_2$ plasma, hydrogen plasma, and $O_2$/Ar sputtering are all operated at less than 1 Torr. Therefore, integrated system 450 is capable of handling a mixture of dry and wet processes. As illustrated in FIG. 2, integrated system 450 has 3 substrate transfer modules (or chambers) 460, 470, and 480. Transfer chambers 460, 470 and 480 are equipped with robots to move substrate 455 from one process area to another process area. It should be appreciated that the process area could be a substrate cassette, a reactor, or a loadlock. Substrate transfer module 460 is operated under lab ambient, which refers to the laboratory (or factory) environment that is under room temperature, atmospheric pressure and exposed to air, usually HEPA- or ULPA-filtered to control particle defects. Module 460 interfaces with substrate loaders (or substrate cassettes) 461 to bring the substrate 455 into the integrated system or to return the substrate to the cassette(s) 461 to continue processing outside the system 450.

In one embodiment, substrate 455 is brought to integrated system 450 to be deposited with a cobalt-alloy, such as Cobalt tungsten boron (CoWB), cobalt tungsten phosphide (CoWP), or Cobalt Tungsten borophosphide (CoWBP), after the substrate has been planarized by metal CMP to remove excess metal from the substrate surface and leaves the metal only in the metal trenches. The surface of substrate 455 is processed to remove surface contaminants such as Cu—BTA complex and other metal oxide residues. Cu—BTA and metal oxides can be removed by a wet clean process involving a cleaning solution, such as a solution containing tetramethylammonium hydroxide (TMAH) or complexing amines such as, but not limited to, ethylene diamine or diethylamine triamine. Following BTA-metal complex removal, metal oxides remaining on the copper and dielectric surfaces can be removed using a wet clean process involving a cleaning solution such as a solution containing citric acid, or other organic acid that can remove copper oxide more or less selectively to copper. Metal oxides, specifically copper oxide, can be removed using a weak organic acid such as citric acid, or other organic or inorganic acids can be used. Additionally, very dilute (i.e. <0.1%) peroxide-containing acids, such as sulfuric-peroxide mixtures, can also be used. The wet clean process can also remove other metal or metal oxide residues.

A wet clean module 463 can be integrated with the lab-ambient transfer module 460, which is operated at lab ambient condition. The wet clean module 463 can be used to perform a 1-step or 2-step cleaning process. Alternatively, an additional wet clean module 463' can be integrated with the lab-ambient transfer module 460 to allow the first step of the 2-step cleaning process to be performed in module 463 and the second step be performed in module 463'. For example, a cleaning solution containing a chemical such as TMAH for cleaning Cu—BTA is in module 463 and a cleaning solution containing a weak organic acid such as citric acid for cleaning metal oxide is in module 463'. Exemplary cleaning solutions are described in U.S. Pat. Nos. 6,165,956, 6,593,282, 6,162,301, 6,294,027, 6,303,551, 6,479,443, and 6,927,198 which are incorporated herein by reference.

As mentioned above, a lab ambient condition occurs under atmospheric pressure and open to the environment in the module. Although the wet clean module 463 can be integrated with the lab-ambient transfer module 460, this process step can also be performed right after metal CMP and before the substrate is brought to integrated system 450 for cobalt-alloy deposition. Alternatively, the wet cleaning process can be performed in a controlled ambient process environment, where the controlled ambient is maintained during and after the wet cleaning step. The U.S. Patent Applications related to proximity heads and their use that are owned by the assignee and specified below provide further information on the structure used to perform the cleaning process in one embodiment.

Organic residues (or contaminants) not removed by the previous wet cleans can be removed by a dry oxidizing plasma process, such as oxygen-containing plasma, $O_2$/Ar sputter, or Ar sputter following the removal of Cu—BTA and metal oxides in a reaction chamber. As described above, most plasma or sputtering processes are operated below 1 Torr; therefore, it is desirable to couple such systems (or apparatus, or chambers, or modules) to a transfer module that is operated under vacuum at pressure, such as under 1 Torr. If the transfer module integrated with the plasma process is under vacuum, substrate transfer is more time efficient and the process module is maintained under vacuum, since it does not require extended time to pump down the transfer module. In addition, since the transfer module is under vacuum, the substrate after cleaning by the plasma process is exposed to only very low levels of oxygen. Assuming the $O_2$ plasma process is selected to clean the organic residues, the $O_2$ plasma process reactor 471 is coupled to a vacuum transfer module 470.

Since lab-ambient transfer module 460 is operated at atmosphere and vacuum transfer module 470 is operated under vacuum (<1 Torr), a loadlock 465 is placed between these two transfer modules to allow substrate 455 to be transferred between the two modules, 460 and 470, operated under different pressures. Loadlock 465 is configured to be operated under vacuum at pressure less than 1 Torr, or at lab ambient, or to be filled with an inert gas selected form a group of inert gases.

After substrate 455 finishes the oxidizing plasma processing using $O_2$, for example, substrate 455 is moved into the hydrogen-containing reducing plasma reduction chamber (or module) 473. Hydrogen-containing plasma reduction is typically processed at a low pressure, which is less than 1 Torr; therefore, it is coupled to the vacuum transfer module 470.

Once the substrate 455 is reduced with hydrogen-containing plasma, the copper surface is clean and free of copper oxide. In a preferred embodiment, after substrate 455 finishes the $O_2$ plasma processing, a $H_2$ or $H_2/NH_3$ plasma reduction step can be performed in-situ, without removing the wafer from the chamber. In either case, the substrate is ready for cobalt-alloy deposition after completion of the reduction process.

As described above, it is important to control the processing and transport environments to minimize the exposure of the copper surface to oxygen after the substrate is reconditioned by the hydrogen-containing reducing plasma. The substrate 455 should be processed under a controlled environment, where the environment is either under vacuum or filled with one or more inert gas to limit the exposure of substrate 455 to oxygen. Dotted line 490 outlines the boundary of a part of the integrated system 450 of FIG. 4B that show the processing systems and transfer modules whose environment is controlled. Transferring and processing under controlled environment 490 limits the exposure of the substrate to oxygen.

Cobalt-alloy electroless deposition is a wet process that involves cobalt species in a solution that is reduced by a reducing agent, which can be phosphorous-based (e.g. hypophosphite), boron-based (e.g. dimethylamine borane), or a combination of both phosphorous-based and boron-based. Typically, the solution that uses phosphorous-based reducing agent deposits CoWP, and the solution that uses boron-based reducing agent deposits CoWB. Accordingly, the solution that uses both phosphorous-based and boron-based reducing agents deposits CoWBP. In one embodiment, the cobalt-alloy electroless deposition solution is alkaline-based. Alternatively, cobalt-alloy electroless deposition solution can also be acidic. Since wet processes are typically conducted under atmospheric pressure, the transfer module 480 that is coupled to the electroless deposition reactor should be operated near atmospheric pressure. To ensure the environment is controlled to be free of oxygen, inert gas(es) can be used to fill the controlled-ambient transfer module 480. Additionally, all fluids used in the process are de-gassed, i.e. dissolved oxygen is removed by commercially available degassing systems. Exemplary inert gas includes nitrogen ($N_2$), helium (He), neon (Ne), argon (Ar), krypton (Kr), and xenon (Xe).

In one embodiment, the wet cobalt-alloy electroless deposition reactor (or apparatus, or system, or module) is coupled with a rinse and dry system (or apparatus, or module) to allow the substrate to be transferred into the electroless deposition system 481 under dry conditions and to come out of the system 481 in a dry condition (dry-in/dry-out). The dry-in/dry-out requirement allows the electroless deposition system 481 to be integrated with the controlled-ambient transfer module 480, and avoids the need of a wet robotic transfer step to a separate rinse-dry module. The environment of the electroless deposition system 481 is controlled to provide low (or limited) levels of oxygen and moisture (water vapor). Inert gas can also be used to fill the system to ensure low levels of oxygen are in the processing environment.

Alternatively, cobalt-alloy electroless deposition can also be conducted in a dry-in/dry-out manner similar to electroless copper disclosed recently. A dry-in/dry-out electroless copper process has been developed for copper electroless deposition. The process uses a proximity head to limit the electroless process liquid in contacting with the substrate surface on a limited region constrained by a liquid meniscus. The substrate surface not under the proximity process head is dry. Details of such process and system can be found in U.S. application Ser. No. 10/607,611, titled "Apparatus And Method For Depositing And Planarizing Thin Films On Semiconductor Wafers," filed on Jun. 27, 2003, and U.S. application Ser. No. 10/879,263, titled "Method and Apparatus For Plating Semiconductor Wafers," filed on Jun. 28, 2004, both of which are incorporated herein in their entireties. The electroless plating of cobalt-alloy can use a proximity head to enable a dry-in/dry-out process. That is, even though a wet process is performed, the substrate comes into the module dry and leaves dry.

After cobalt-alloy deposition in system 481, substrate 455 can be rinsed and dried within the same cobalt-alloy deposition in system 481 by a proximity head or can optionally be sent through an separate post-deposition cleaning chamber. Further information on the structure of proximity heads and their use may be found in U.S. Pat. Nos. 6,988,327, 6,954, 993, 9,988,326, and patent application Ser. Nos. 10/330,843, 10/261,839, 60/686,787, and 11/461,415, all of which are co-owned by the Assignee and are incorporated by reference. Alternatively, non-brush particle removal processes described in U.S. publications 2006012860 and 2006012859, both incorporated by reference herein, may be employed as well. A rinse and dry system must also be integrated with the brush scrub system or non-brush methods described in U.S. publications 2006012860 and 2006012859 to allow substrate 455 to be dry-in/dry-out of the wet cleaning system 483. Other methods of mechanical assisted cleaning may be utilized, such as a brush scrub using chemistry such as CP72B or hydroxylamine-based cleaning chemistries or by using other methods, such as immersion cleaning, or spin-rinse cleaning, Inert gas(es) is used to fill system 483 to ensure limited (or low) oxygen is present in the system. In one embodiment, the oxygen level is below 3 parts per million (ppm). The system 483 is dotted to illustrate that this system is optional, since the post-deposition cleaning is optional. Since the post-deposition clean step is the last process that is to be operated by the integrated system 450, substrate 455 is brought back into cassette 461 after processing. Therefore, the cleaning system 483 can alternatively be coupled to the lab-ambient transfer module 460, as shown in FIG. 4B. If the cleaning system 483 is coupled to the lab-ambient transfer module 460, the cleaning system 483 is not operated under controlled environment and inert gas(es) does not need to fill the system.

FIG. 3 is a simplified schematic diagram showing a cross sectional view of an electroless deposition module in accordance with one embodiment of the invention. Electroless deposition module 481 includes a first chamber wall 300. In one embodiment, the chamber wall 300 is composed of aluminum. Within chamber 300 is a second chamber 302. Chamber 302 is composed of a Polytetrafluoroethylene (PTFE) material in one embodiment, however, it should be appreciated that the material of composition for chamber 302 may be any suitable material that is compatible with the chemicals and operating conditions used herein for the electroless deposition. Chuck 318 supports wafer 314 within module 481. In one embodiment, chuck 318 is a heated chuck. It should be noted that chuck 318 may also be referred to as a support. That is, through any suitable means, e.g., electrical resistance or other suitable techniques for providing heat from chuck 318, heat is provided to substrate 455. Chuck 318 is surrounded by bowl 304. Bowl 304, as illustrated, includes an indentation at the bottom of chuck 318 and the sidewalls of bowl 304 comes up above the surface of chuck 318 so as to create a cavity where a solution may reside on top of a wafer sitting on the chuck and confined by the sidewalls. The indentation, also referred to as an annular channel around an inner diameter of the base of bowl 304, will provide for excess material to be collected and drained from bowl 304 through drain 312. In essence, the indentation defines an annular ring, which collects excess material or any material lost from substrate 455, for delivery to drain 312.

Still referring to FIG. 3, the chemical solutions described above may be deposited through nozzle 308 or any other suitable delivery means into the cavity in which substrate 455 sits. The cavity is defined by the space created by the upper edge of bowl 304 that rises above substrate 455 and the top surface of the substrate. Of course the delivery of the plating solution may occur with the reducing agent being provided at the point of use as mentioned above. Gate valve 310 enables the introduction of the air or the removal of air from electroless deposition module 481. It should be appreciated that the vacuum pull down/air removal may occur in stages or pulses, i.e., a vacuum pulse followed by introduction of an inert gas, followed by a vacuum pulse, followed by introduction of an inert gas, etc. In one embodiment, chuck 318 moves in a vertical position as indicated by arrow 301 so as to provide the ability to perform additional cleaning within electroless deposition module 481 after the plating operation has completed. In this embodiment, chuck 318 moves to a first position above the initial position, after completion of the electroless deposition in order to remove the plating solution from the upper surface of wafer 455. Here, a de-ionized water solution may be sprayed on top of the wafer in order to remove the solution. The means for spraying the solution may be a nozzle in flow communication with a reservoir of fluid, similar to the nozzle described above for delivering the plating solution or preferably a proximity head may be used to clean, rinse and dry the substrate. After removal of the solution, chuck 318 may move up to a second position, above the first position, where a proximity head may be used to perform a clean and dry operation. Of course, chuck 318 can remain at the first position for the clean and dry operation by proximity head(s). It should be appreciated that as chuck 318 lifts from an initial position, where the electroless deposition takes place, to the first position where the remnants of the deposition process are removed, rollers 303 may be used to support the wafer. One skilled in the art will appreciate that transfer of substrate 455 to rollers 303 may be accomplished through the use of a robot or other known mechanical means. In an alternative embodiment, chuck 318 may be able to rotate as an alternative to the rollers. Of course, for the embodiments using a proximity head, the proximity head is capable of lateral, rotational, translational and vertical movement.

Figure 3A:
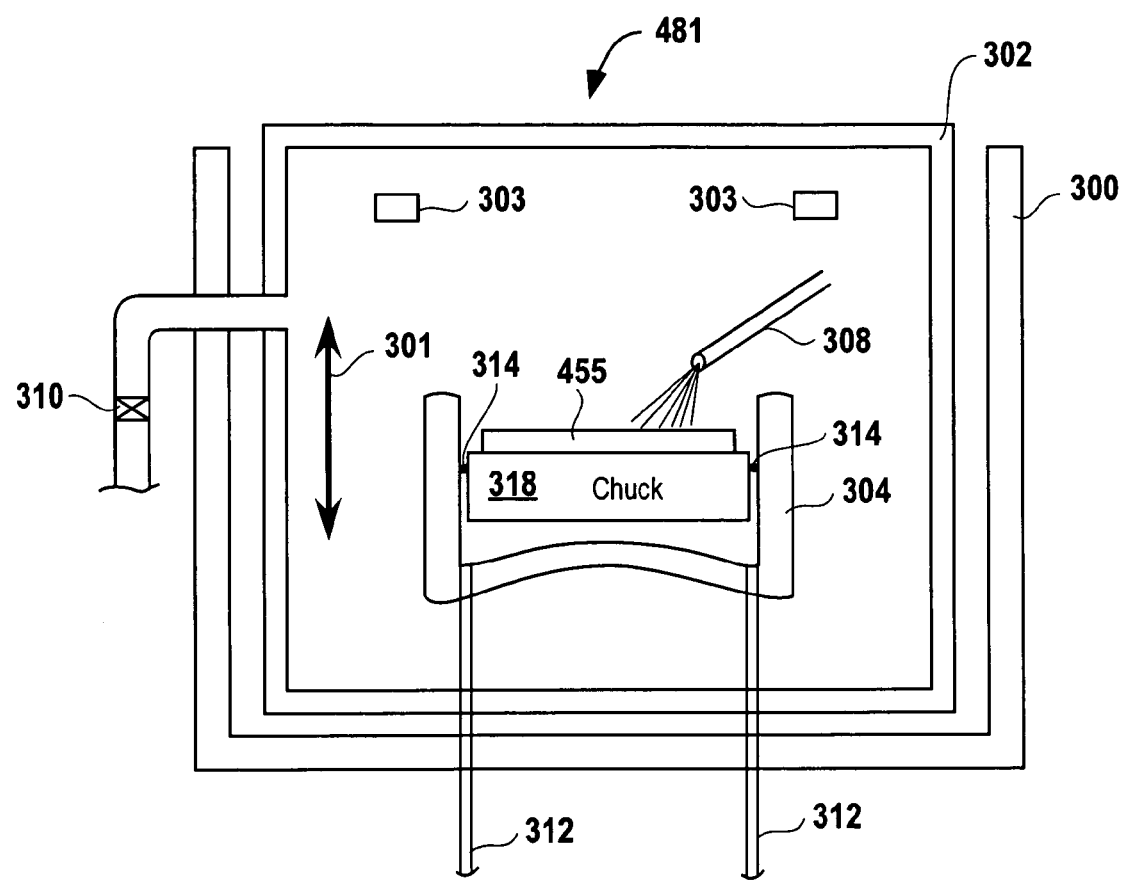
FIG. 3A is a simplified schematic diagram showing a cross sectional view of an electroless deposition module in accordance with one embodiment of the invention.
Figure 3B:
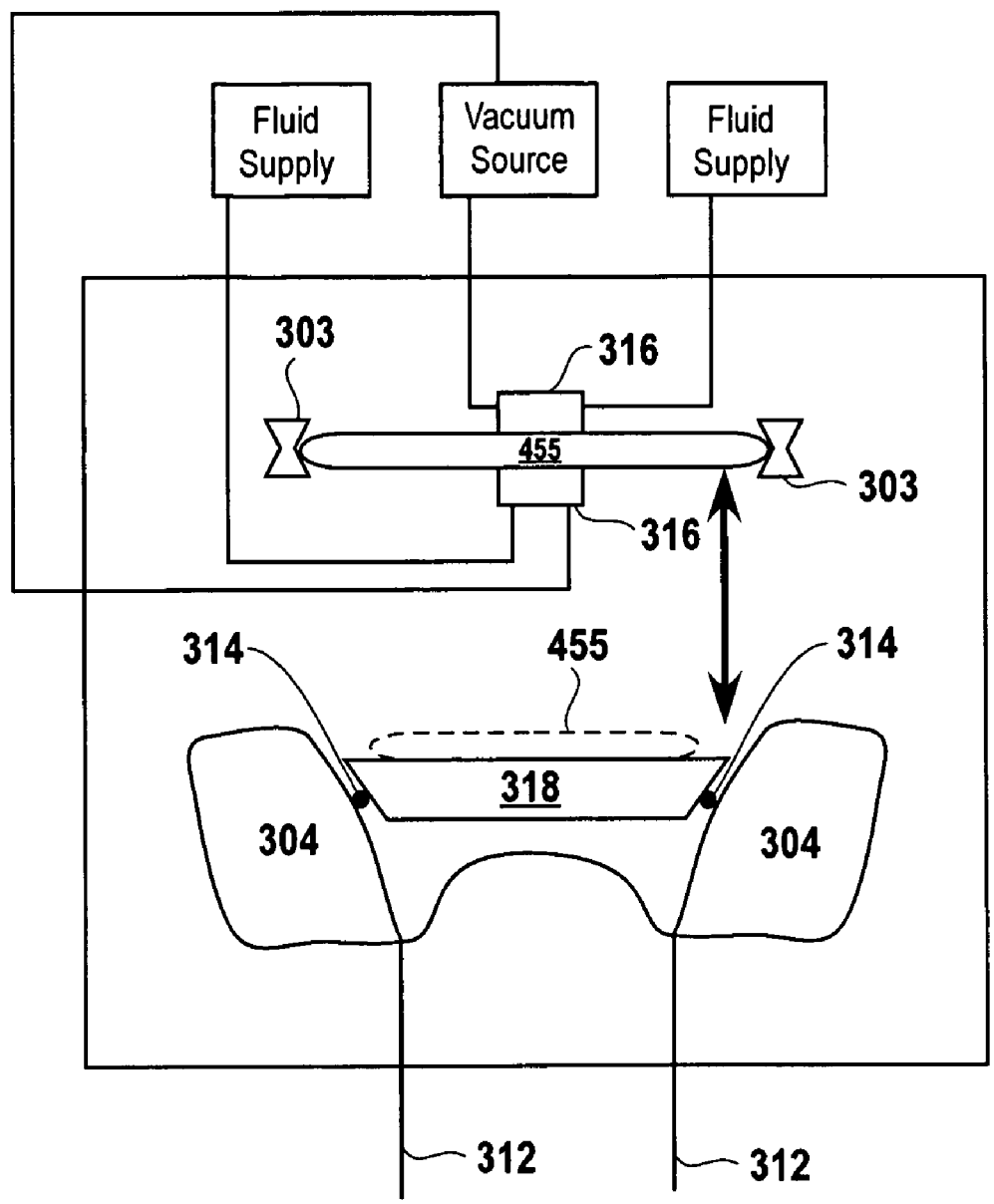
FIG. 3B is a simplified schematic diagram showing an alternative embodiment of the electroless deposition module of FIG. 3A.

FIG. 3B is another embodiment for the deposition module of FIG. 3A. In FIG. 3B, wafer 455 is raised from an initial position on chuck 318 to be supported by rollers 303. As illustrated in FIGS. 3A and 3B, chuck 318 forms a seal against the sidewalls of bowl 304. Thus, as chuck 318 is moved vertically, the seal against O-ring 314 breaks, thereby allowing fluid from the electroplating process to drain through drain 312. It should be appreciated that a robot or other known mechanical means may transport wafer 455 between chuck 318 and rollers 303. Proximity heads 316 are used to clean wafer 455 as discussed in U.S. Pat. Nos. 6,988,327, 6,954,993, 9,988,326, and patent application Ser. Nos. 10/330,843, 10/261,839, 60/686,787, and 11/461,415 mentioned above. Proximity heads 316 are in communication with a vacuum source and fluid supplies, as illustrated. Thus, within the module of FIGS. 3A and 3B, the rinsing and drying, as well as the plating process all occur within the same chamber, which can have a controlled environment, e.g., substantially free from oxygen.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. An electroless plating chamber, comprising:
    a chuck configured to support a substrate,
    a bowl surrounding a base and a sidewall of the chuck, the base having an annular channel defined along an inner diameter of the base, wherein a periphery of the chuck is sealed against an inner surface of the bowl;
    a drain connected to the annular channel, the drain capable of removing fluid collected from the chuck, and
    a proximity head capable of cleaning and substantially drying the substrate.

2. The electroless plating chamber of claim 1, further comprising:
    a fluid delivery system configured to deliver a fluid to a top surface of the substrate supported by the chuck.

3. The electroless plating chamber of claim 1, wherein the chuck is configured to provide heat to the substrate.

4. The electroless plating chamber of claim 1, wherein the substrate is moved to a first position above an initial position to break a seal with the inner surface of the bowl to remove plating solution remaining on a top surface of the substrate.

5. The electroless plating chamber of claim 4, wherein the chuck is configured to move to a second position above the first position to perform a clean and dry operation with the proximity head.

6. The electroless plating chamber of claim 5, wherein the substrate is transferred from the chuck to rollers at one of the first or the second positions.

7. The electroless plating chamber of claim 1, further comprising;
    a first chamber surrounding the chuck and the bowl; and
    a second chamber surrounding at least a base and a sidewall of the first chamber.

8. The electroless plating chamber of claim 7, wherein the first chamber is composed of Polytetrafluoroethylene and the second chamber is composed of aluminum.

9. The electroless plating chamber of claim 1, wherein an environment within the chamber is substantially oxygen-free.

* * * * *